(12) United States Patent
Sasaki et al.

(10) Patent No.: US 6,176,137 B1
(45) Date of Patent: Jan. 23, 2001

(54) PRESSURE SENSOR

(75) Inventors: Keiji Sasaki; Jun-ichi Miyano; Akira Sawada, all of Tokyo (JP)

(73) Assignee: Fujikoki Corporation, Tokyo (JP)

( * ) Notice: Under 35 U.S.C. 154(b), the term of this patent shall be extended for 0 days.

(21) Appl. No.: 09/262,067

(22) Filed: Mar. 4, 1999

(30) Foreign Application Priority Data

Apr. 9, 1998 (JP) .................................................. 10-097861
Sep. 30, 1998 (JP) .................................................. 10-277629

(51) Int. Cl.[7] ...................................................... G01L 9/00
(52) U.S. Cl. ................................................................ 73/754
(58) Field of Search ............................ 73/700, 715, 721, 73/727, 728, 754, 756

(56) References Cited

U.S. PATENT DOCUMENTS

| 4,129,042 | 12/1978 | Rosvold ................. | 73/727 |
| 4,939,497 | 7/1990 | Nishida et al. ........... | 338/4 |
| 4,972,716 | * 11/1990 | Tobita et al. ............ | 73/721 |
| 5,186,055 | * 2/1993 | Kovacich et al. ........ | 73/727 |
| 5,257,546 | 11/1993 | Tobita et al. ............ | 73/727 |
| 5,315,877 | * 5/1994 | Park et al. .............. | 73/724 |

FOREIGN PATENT DOCUMENTS

| 44 42 478 A1 | 6/1995 | (DE) . |
| 0 762 097 A1 | 3/1997 | (EP) . |
| 2 293 704 | 7/1976 | (FR) . |
| 1 248 087 | 9/1971 | (GB) . |
| 06281519 | 7/1994 | (JP) . |

* cited by examiner

Primary Examiner—Benjamin R. Fuller
Assistant Examiner—Abdullahi Aw-musse
(74) Attorney, Agent, or Firm—Armstrong, Westerman, Hattori, McLeland & Naughton

(57) ABSTRACT

A pressure sensor 1 comprises a metallic housing 10 having a space 18 communicated to a pressure detection space and a thin rising portion 17 formed on the upper end of the peripheral area, a sensor element 20, a sensor element holder 30, a metallic pressure case 60 having a ceiling portion 61, and a connector case 70 formed of an insulating material, wherein a collar portion 211 of a base plate 21 of the sensor element 20 including a pressure sensing element 22 is contacted to an annular protrusion 33 positioned around the opening 32 of the sensor element holder 30, and the collar portion 211 is airtightly welded to the annular protrusion 33 by projection welding. Further, the collar portion 63 on the pressure case 60 and the peak surface 35 of the holder 30 is airtightly welded by an electron beam welding. The airtight interior space defined by the sensor element 20, the sensor element holder 30 and the pressure case 60 is utilized as the reference pressure space.

33 Claims, 8 Drawing Sheets

PRESSURE SENSOR

FIELD OF THE INVENTION

The present invention relates to a pressure sensor, and particularly, to a pressure sensor having a housing for storing a sensor element and a connector case, the sensor adopting an absolute pressure method or a sealed gauge pressure method, which is free from any effects caused by electromagnetic noise.

Further, the present invention relates to a pressure sensor wherein the sensor element being stored inside a housing is welded thereto with advantageous airtightness.

DESCRIPTION OF THE RELATED ART

A strain gage-type semiconductor pressure sensor of the prior art is disclosed, for example, in Japanese Laid-Open Patent Publication No. 7-29435. In this prior art pressure sensor, a pressure sensor element (pressure sensor chip) is mounted on a concave formed on a body (corresponding to the housing of the present invention) through a metallic base (corresponding to the base plate of the present invention) and a glass base. Pressure is impressed to the pressure sensor element through a penetrating hole formed concentrically on the body, the metallic base and the glass base, respectively. The metallic base is fixed to the body by a laser welding technique.

The applicant of the present invention filed a Japanese patent application No. 9-185141 which disclosed a pressure sensor for sensing the pressure of a fluid. The disclosed pressure sensor comprises a metallic housing having an interior space being communicated to a pressure sensing space and further having a thin rising portion on the upper end thereof, a cylindrical metallic pressure case having an interior space, a separation wall for vertically separating the interior space, and a thin rising portion on the upper end thereof, and a connector case formed of an insulating material, wherein the housing, the pressure case and the connector case are stacked up, the rising portions of each member being caulked so as to form an integrated body, and an electrical circuit and a sensor element for sensing pressure are stored inside the interior space formed in said integrated body. The housing comprises a fluid introducing hole formed on the bottom portion of the interior space which is communicated to the pressure sensing space, and an annular protrusion formed surrounding the opening of the pressure introducing hole on the bottom portion. The sensor element is formed by layering a pressure sensing element formed on a semiconductor board, an upper base made of glass, a lower base made of silicon, and a metallic base plate. The pressure case comprises an opening to which the penetrating condenser is inserted. The bottom surface of the base plate of the sensor element is mounted on the annular protrusion, and both members are welded together and fixed airtightly by an electrical resistance welding.

SUMMARY OF THE INVENTION

When the prior art sensor was used in the refrigeration cycle of an air conditioner mounted on vehicles, the variation in the atmospheric pressure based on the difference in altitude had effects on the sensing of pressure, and there was fear that a deviation may be generated in the pressure being sensed. Therefore, high demand exists for pressure sensors adopting an absolute pressure method where no effect will be caused by the atmospheric pressure, or a sealed gauge pressure method and the like where the reference pressure is sealed at atmospheric pressure, which is used as reference when measuring pressure.

The present invention aims at responding to such demand, and the object of the invention is to provide a pressure sensor adopting either the absolute pressure method or the sealed gauge pressure method.

Further, the object of the present invention is to provide a pressure sensor enabling the sensor element and the housing to be formed of different metallic materials, when creating the reference pressure space by welding.

Even further, the object of the present invention is to provide a pressure sensor enabling the sensor element and the housing to be formed of different metallic materials, when welding and supporting the sensor element.

In order to solve the problem, the pressure sensor according to the present invention relates to a pressure sensor for sensing pressure by a sensor element formed of a semiconductor element having a piezoresistance effect; wherein said sensor element is airtightly fixed to a holder using a base plate for mounting said sensor element, said holder being airtightly fixed to a pressure case having an electromagnetic shield function and forming a reference pressure space by covering said sensor element, and said holder being supported by a housing having a pressure introducing hole.

Further, the pressure sensor according to the present invention relates to a pressure sensor comprising a housing having a pressure introducing hole, a sensor element formed of a semiconductor element having a piezoresistance effect, a holder to which said sensor element is fixed, and a pressure case having a ceiling portion, said sensor element, said holder and said pressure case being welded airtightly together to form a reference pressure space; wherein said sensor element is formed by layering said semiconductor element, an upper base made of glass, a lower base made of silicon, and a metallic base plate; said holder includes an opening formed in the center portion thereof, an annular protrusion positioned surrounding said opening at the lower surface thereof, and a flat surface formed on the peak surface of the rising portion formed around said holder; said pressure case includes a collar portion where the lower end of the surrounding wall hanging from said ceiling portion is bent outwardly; said base plate of said sensor element is welded and fixed airtightly to said annular protrusion of said holder; and said collar portion of said pressure case is welded and fixed airtightly to said peak surface of said holder.

According to the pressure sensor mentioned above, the holder being provided not only enables to define a reference pressure space, but it also works to prevent the direct airtight welding of the heading and the housing, which makes it possible to select the material of each member optionally, and therefore, different kinds of metal may be used to form the base plate and the housing.

Moreover, the pressure sensor according to the present invention relates to a pressure sensor comprising a metallic housing having a pressure introducing hole, a sensor element formed of a semiconductor element having a piezoresistance effect, a holder to which said sensor element is airtightly fixed, and a metallic pressure case having a ceiling portion, said sensor element, said holder and said pressure case being welded airtightly together to form a reference pressure space; wherein said sensor element is formed by layering said semiconductor element, an upper base made of glass, a lower base made of silicon, and a metallic base plate; said holder comprises an interior space, an opening formed in the center portion thereof, an annular protrusion positioned surrounding said opening at the lower surface thereof, and a flat surface formed on the peak surface of the rising portion formed around said holder; said pressure case comprises a collar portion where the lower end of the surrounding wall hanging from said ceiling portion is bent outwardly; said base plate is welded and fixed airtightly to said annular protrusion of said holder; and said collar portion of said pressure case is welded and fixed airtightly to said peak surface of said holder.

By mounting a collar portion to the pressure case, the collar portion and the holder may be welded and fixed together in a more secure manner.

Moreover, the pressure sensor according to the present invention relates to a pressure sensor, wherein said pressure case is equipped with an airtight penetrating condenser, and said penetrating condenser guides the output from said sensor element to a predetermined exterior terminal.

Even further, the penetrating condenser is positioned inside said reference pressure space and being connected to a circuit board for converting the output from said sensor element to a PWM signal.

By forming a penetrating condenser as above, the output from the sensor element inside the reference pressure space or PWM (pulse wide modulation) signal may be gained.

Further, the present invention relates to a pressure sensor comprising a sensor element formed of a semiconductor element having a piezoresistance effect, a housing for introducing pressure to said sensor element, and a holder for supporting said sensor element, wherein said holder airtightly supports said sensor element while being supported by said housing.

The present invention further relates to a pressure sensor comprising a sensor element formed of a pressure sensing element, a base and a base plate, and a holder for supporting said sensor element; wherein said base plate of said sensor element is welded airtightly to said holder; and said holder is supported by a housing having a pressure introducing hole.

The present invention further relates to a pressure sensor comprising a housing having a pressure introducing hole, a sensor element having a pressure sensing element, and a holder for supporting said sensor element; wherein said sensor element is formed by layering a semiconductor element having a piezoresistance effect, an upper base made of glass, a lower base made of silicon, and a metallic base plate; said holder comprises an opening formed in the center portion thereof and an annular protrusion positioned surrounding said opening at the lower surface thereof; and the base plate of said sensor element is welded and fixed airtightly to said annular protrusion of said holder.

The present invention relates to a pressure sensor comprising a sensor element formed of a pressure sensing element, a base and a base plate, and a holder for supporting said sensor element; wherein said base plate of said sensor element is welded and fixed airtightly to said holder; and said holder is welded and fixed airtightly to a pressure case having an electromagnetic shield function and forming a reference pressure space by covering said sensor element, said holder being further supported by a housing having a pressure introducing hole.

In the pressure sensor disclosed above, the present invention further characterizes in that a predetermined gas is sealed inside said reference pressure space.

The present invention further relates to a pressure sensor comprising a housing having a pressure introducing hole, a sensor element having a pressure sensing element formed of a semiconductor element, a holder to which said sensor element is fixed, and a pressure case having a ceiling portion, said sensor element, said holder and said pressure case being welded airtightly together to form a reference pressure space; wherein said sensor element is formed by layering said semiconductor element, an upper base made of glass, a lower base made of silicon, and a metallic base plate; said holder comprises an opening formed in the center portion thereof, an annular protrusion positioned surrounding said opening at the lower surface thereof, and a flat surface formed on the upper surface thereof; said pressure case comprises a collar portion where the lower end of the surrounding wall hanging from said ceiling portion is bent outwardly, and an annular protrusion is formed on the surface opposing said holder; said base plate of said sensor element is welded and fixed airtightly to said annular protrusion of said holder; and said annular protrusion formed on the collar portion of said pressure case is welded and fixed airtightly to said flat surface of said holder.

Moreover, the present invention relates to a pressure sensor comprising a housing having a pressure introducing hole, a sensor element having a pressure sensing element formed of a semiconductor element, a holder for supporting said sensor element, and a pressure case having a ceiling portion, said sensor element, said holder and said pressure case being welded airtightly together to form a reference pressure space; wherein said sensor element is formed by layering said semiconductor element, an upper base made of glass, a lower base made of silicon, and a metallic base plate; said holder comprises an opening formed on the center portion thereof, an annular protrusion positioned surrounding said opening at the lower surface thereof, and an annular protrusion positioned opposing said pressure case; said pressure case comprises a collar portion where the lower end of the surrounding wall hanging from the peripheral of said ceiling portion is bent outwardly; said base plate of said sensor element is welded and fixed airtightly to said annular protrusion positioned on the lower surface of said holder; and said collar portion of said pressure case is welded and fixed airtightly to said annular protrusion on said holder positioned opposing said pressure case.

In the pressure sensor mentioned above, the present invention further characterizes in that said pressure case is airtightly equipped with a penetrating condenser having electrodes mounted on the inner and outer surfaces of a pipe-like dielectric, and the output from said sensor element is guided to a predetermined exterior terminal by being penetrated through said penetrating condenser.

In the pressure sensor mentioned above, the present invention further characterizes in that a bypassing condenser is connected in parallel relation with said penetrating condenser, and the other end of said bypassing condenser is connected to said pressure case.

PREFERRED EMBODIMENT OF THE INVENTION

Figure 1:
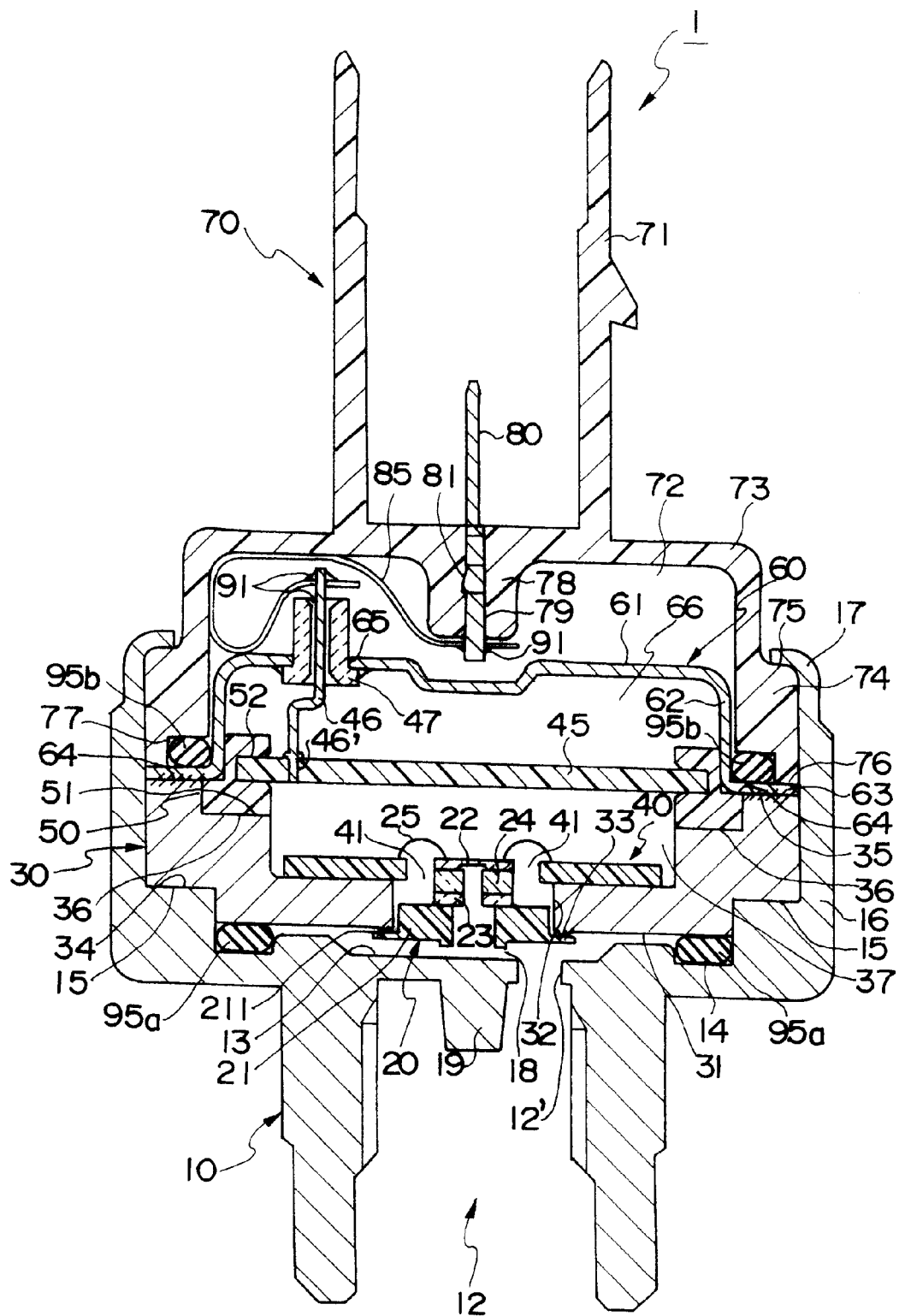
FIG. 1 is a vertical cross-sectional view showing the structure of the pressure sensor according to the first embodiment of the present invention.

The first preferred embodiment of the pressure sensor according to the present invention will now be explained with reference to FIG. 1. FIG. 1 is a vertical cross-sectional view showing the structure of the pressure sensor.

A pressure sensor 1 according to the first embodiment of the present invention comprises a housing 10, a sensor element 20, a holder 30, a first circuit board 40, a second circuit board 45, a second circuit board holder 50, a pressure case 60, and a connector case 70.

The pressure sensor 1 stores the sensor element 20, the holder 30 and the pressure case 60 inside a container formed of the housing 10 and the connector case 70.

The housing 10 is formed to have a substantially cylindrical shape by use of an aluminum material and the like.

The housing 10 is comprised of the following. An opening 12 is formed on the lower portion of the housing for introducing fluid. On the upper portion of the opening is formed a circular bottom portion 13, and surrounding the bottom portion is an annular groove 14 working as an o-ring receiver, and on the outer and upper portion thereof is formed a flat surface 15 working as a holder receiver. A surrounding wall 16 is formed to rise from the outer peripheral of the flat surface, and a narrow portion 17 is formed on the upper end of the surrounding wall. Further, an interior space 18 is formed inside the body defined by the bottom portion, the flat portion and the surrounding wall, and a lower protrusion 19 is formed to extend downward from the bottom portion 13 toward the fluid introducing opening.

The fluid introducing hole 12 and the interior space 18 of the housing 10 is communicated by a penetrating hole 12' for introducing fluid formed on the bottom portion 13.

The housing 10 is fixed by screwing the screw mounted on the fluid introducing hole 12 of the housing 10 to the pipe on the side of the pressure to be measured. At this time, the valve mounted on the tip of the pipe is pressed by the lower protrusion 19, thereby releasing the valve, and the pressure to be measured is loaded to the fluid introducing opening 12.

The sensor element 20 is equipped with a function to detect pressure, and it is comprised of a metallic base plate 21, a pressure sensing element 22 formed of a semiconductor element having a piezoresistance effect mounting a plurality of resistors on the upper surface of the semiconductor substrate so as to form a bridge, a lower base 23 made of silicon which is airtightly fixed to the upper surface of the base plate 21, and an upper base 24 made of glass which is airtightly mounted and fixed to the upper surface of the lower base 23.

The lower base 23 is mounted and fixed to the upper surface of the base plate 21, and the upper base 24 is mounted and fixed airtightly to the upper surface of the lower base 23. The pressure sensing element 22 is mounted and fixed to the upper surface of the upper base 24 so that the surface to which resistors are mounted becomes the upper surface.

On the lower area surrounding the base plate 21 is formed a collar portion 211.

The pressure sensing element 22 is formed so that the plain shape of the semiconductor substrate is rectangular, and the center area thereof is formed thinner, so as to form a diaphragm portion which will be deformed by pressure. On the upper surface of the diaphragm is formed a pressure sensing portion which is a strain gauge, having a plurality of resistors formed in a bridge state as piezoresistor elements. On the surrounding thick portion of the substrate is mounted electric circuits such as a processing circuit or an amplifying circuit formed by use of an integrated circuit manufacturing technique.

Further, a land portion not shown in the drawing mounted on the upper surface of the pressure sensing element 22 and the land portion not shown in the drawing mounted on the upper surface of the first circuit board 40 are connected by a bonding wire 25.

The upper base 24 made of a glass material such as a Pyrex glass (trademark) and the like is formed to have a rectangular plain shape, with a penetrating hole formed in the center thereof.

The lower base 23 made of silicon is formed to have a rectangular plain shape, with a penetrating hole formed in the center thereof. The surface of junction of the lower base 23 with the base plate 21 is formed to have a gold plated layer formed by gold sputtering and the like.

The base plate 21 is formed of an iron-nickel system alloy of 42 alloy and the like, and the plain shape thereof is circular, with a penetrating hole formed in the center thereof. The surface of junction of the base plate 21 with the lower base 23 is formed to have a gold plated layer.

The penetrating holes formed on the upper base 24, the lower base 23 and the base plate 21 are positioned coaxially, and being communicated to the fluid introducing opening 12 of the housing 10, so as to guide the pressure fluid to the space formed on the back surface of the pressure sensing element 22.

The lower surface of the pressure sensing element 22 is welded and fixed airtightly to the upper surface of the upper base 24 by an anode junction (FAB junction). The lower surface of the upper base 24 is welded and fixed airtightly to the upper surface of the lower base 23 by an anode junction. By intervening a gold-silicon raw material and providing heat application (scrub) thereto, a gold-silicon alloy is formed to the lower surface of the lower base 23 and the upper surface of the base plate 21, thereby welding and fixing the base 23 and the base plate 21 airtightly.

The holder 30 together with the pressure case 60 define a space for the reference pressure.

The holder 30 is formed by use of a stainless steel and the like, and shaped like a container with a two-step bottom. The holder 30 is equipped with an opening 32 formed on the center portion of the bottom surface 31, and surrounding the opening 32 is mounted an annular protrusion 33 formed to have an annular shape.

On the surrounding area of the bottom surface 31 of the holder 30 is formed a housing contact surface 34 for contacting the receiver 15 for the holder 30 of the housing 10. On the peak surface of the surrounding wall rising up from the bottom portion is a welding surface 35 which will be welded to the pressure case 60.

An interior space 37 is formed to the interior of the holder 30, and a circuit board holder receiving surface 36 is equipped on the surrounding of the interior space.

On the bottom surface of the interior space 37 in the holder 30 is fixed a first circuit board 40 by an adhesive and the like.

The upper surface of the collar portion 211 on the base plate 21 of the sensor element 20 is contacted to the annular protrusion 33 formed on the lower surface 31 of the holder 30, and they are welded and fixed airtightly together by a projection welding and the like.

The first circuit board 40 is made of an insulating printed circuit board, and an opening 41 is formed to the center thereof where a pressure sensing element 22 of the sensor element 20 is to be positioned.

The second circuit board 45 is made of an insulating printed circuit board, which is equipped with a circuit for performing a PWM process to the electronic signals from the first circuit board 40 and outputting the same, and a lead 46 for taking out the signal to the exterior.

A circuit board holder 50 for supporting the second circuit board 45 is constituted by forming an insulating material made of resin into a disk shape. On the lower surface thereof is formed a holder contact surface 51 which contacts the circuit board holder receiving surface 36. A groove 52 is formed on the inner circumferential side of the holder 50 for supporting the second circuit board 45. Further, instead of forming a groove 52, the second circuit board 45 may be mounted to the circuit board holder 50 and fixed thereto by an adhesive.

The pressure case 60 is formed for example of stainless steel, and functions as an electromagnetic shield covering the sensor element 20 positioned in its interior space for protection from exterior noise, and works as a member for defining an airtight interior space.

The pressure case 60 comprises a disk-shaped ceiling portion 61, a surrounding wall 62 rising from the peripheral portion thereof, a collar portion 63 formed by bending the end of the surrounding wall 62 to the outward direction and having a welding surface 64 to be contacted to the receiving surface 35 of the holder 30 on its lower surface, and an opening 65 through which a penetrating condenser extends forming a lead takeout portion. An interior space 66 is formed inside this hat-like pressure case 60.

The welding surface 64 formed on the lower surface of the collar portion 63 on the pressure case 60 is contacted against the receiving surface 35 of the holder 30, and the two members are welded airtightly together, for example, by an electron beam welding.

The tip of the lead 46 inserted through the penetrating hole 46' of the second circuit board 45 is taken out to the exterior of the pressure case 60 through the penetrating hole of a pipe-like dielectric 47 forming the penetrating condenser. The penetrating hole of the dielectric 47 through which the lead 46 extends is sealed by a solder 91.

A connector case 70 is a resin case to which a terminal 80 is inserted and fixed. The case 70 comprises a socket 71 formed on the upper portion thereof, an interior space 72 formed below the socket 71, a surrounding wall 73 extending to the downward direction, a thick wall portion 74 formed below the surrounding wall 73, a caulk receiver 75 formed on the outer upward area of the thick wall portion, a flat surface 76 on the lower end of the surrounding wall, an o-ring receiver 77 formed on the inner peripheral of the flat surface, a protrusion 78 extending downward from the socket 71, and a terminal insertion hole 79 formed on the protrusion through which the terminal 80 extends. The terminal 80 having a stopper 81 is inserted to the terminal insertion hole 79 from the lower direction, and fixed thereto.

By changing the shape of the connector case 70, it may be able to correspond to various types of connectors.

The first circuit board 40 is made of an insulating resin and the like, formed to have a rectangular shape with an opening 41 on the center area thereof for mounting the sensor element 20. On the surface of the board 40 are mounted circuit elements constituting amplifying circuits and processing circuits not shown in the drawing, and the signal from the pressure sensing element 22 is inputted to the circuit elements through a bonding wire 25.

A hole 46' for inserting the lower end of the lead 46 is formed on the second circuit board 45, and on the front surface (and the back surface) of the board 45 are mounted circuit elements constituting processing circuits and amplifying circuits for PWM processing not shown in the drawing, which are connected to the input/output terminal of the first circuit board 40 through a lead wire not shown in the drawing.

A lead 46 is a lead wire for connecting the terminal 80 and the input/output terminal (land portion) formed on the second circuit board 45, and the lead 46 includes signal wires, power supply wires and ground wires. The base of the lead 46 is mounted on a land portion not shown formed on the second circuit board 45, and electrically connected and fixed thereto by soldering and the like.

The lead 46 taken out from the pressure case 60 is soldered and connected to the lower end of the terminal 80 through a flexible print wiring connected by a solder 91.

The terminal 80 comprises a power wire and a ground wire to be used for supplying power to the electric circuit, and a ground wire and a signal wire being used for taking out the output signal from the sensor element 20 to the exterior.

O-rings 95a and 95b are each inserted to an o-ring receive groove 14 and an o-ring receive groove 77, so as to prevent water or moisture and the like from entering the interior space 72 of the connector case 70.

The steps for assembling the pressure sensor 1 using the above-mentioned members will now be explained.

First, the sensor element 20 is assembled. The element 20 is formed as explained above by use of the upper base 24, the lower base 23 and the base plate 21.

Next, the pressure sensing element 22 of the sensor element 20 is inserted to the opening 32 of the holder 30, and then the upper surface of the collar portion 211 on the base plate 21 is mounted to the annular protrusion 33. Then, a projection electrode having approximately the same annular shape as the protrusion 33 is contacted to the back surface of the collar portion 211, so as to fix the collar portion to the annular protrusion 33 airtightly.

Next, the first circuit board 40 is fixed to the bottom of the interior space 37 in the holder 30 by an adhesive, and then the land portion of the pressure sensing element 22 and the land portion of the first circuit board 40 are connected by the bonding wire 25.

Next, the second circuit board 45 which is electrically connected to the first circuit board 40 is supported by the circuit board holder 50, which is mounted on the board holder receiver 36 of the holder 30.

The lead 46 mounted on the second circuit board 45 is positioned and inserted through the penetrating hole of the penetrating condenser soldered to the penetrating condenser opening 65 of the pressure case 60. Then, after the welding surface 35 of the holder 30 and the collar portion 63 of the pressure case 60 is connected, solder 91 is poured into the penetrating hole of the penetrating condenser, so as to shut the opening of the pressure case 60.

When doing so, the pressure inside the interior space should be either vacuum or decompressed, so as to securely fill the interior of the penetrating hole by the molten solder 91.

Thereafter, the collar portion 63 and the welding surface 35 are welded together by an electron beam welding and the like. Since the welding is performed under a highly vacuum state, the interior space 66 is maintained in a vacuum state.

As explained, the welding may be performed easily and firmly by the existence of a collar portion, and the pressure sensor body with an airtight interior space 37, 66 working as the reference pressure space may be assembled.

Next, the tip of the lead 46 extending above the pressure case 60 is soldered to the wire of the flexible printed circuit 85 soldered to the terminal 80 which is fixed to the connector case 70. The connector case 60 is then put above the pressure sensor body so as to cover the same, with a waterproof o-ring 95b intervened therebetween.

Then, the pressure sensor body and the assembled connector case gained by the above steps is inserted to the interior space 18 of the housing 10 having an o-ring 95a positioned on the o-ring receiver 14 of the housing 10, and the housing contact surface 34 of the holder 30 is contacted to the sensor element holder receiver 15 of the housing 10.

Thereafter, the narrow area 17 on the upper end of the rising portion 16 of the housing 10 is caulked to the caulk receiver 75 of the connector case 70, so as to fix the housing 10 to the connector case 70.

By the above-mentioned steps, the pressure sensor 1 may be assembled.

According to the present invention, even if the material used for the base plate 21 of the sensor element 20 and the material of the housing 10 is different, the base plate 21 and the housing 10 will not be directly welded and fixed to each other since the holder 30 exists, so the problems related to welding different metal materials may be avoided by the invention. Further, the material of the base plate 21 and the holder 30 may be selected so that they may be securely welded to each other, so a pressure sensor having a secure airtightness between the base plate 21 and the annular protrusion 33 of the holder 30 may be provided.

Moreover, according to the present invention, the upper surface of the collar portion 211 on the base plate 21 of the sensor element 20 is welded and fixed to the annular protrusion 33 formed on the outer bottom surface 31 of the holder 30. Therefore, the pressure to be measured will be loaded in the direction pressing the base plate 21 toward the protrusion 33, and not to the opposite direction pulling the welded surface away from each other. Therefore, the airtightness of the device maybe maintained for a long period of time, and a pressure sensor having a long lifetime may be provided.

Moreover, in the present embodiment, an electron beam welding was used for the welding of the holder 30 and the pressure case 60, but other welding methods may also be used.

Further, the present embodiment referred to the example of performing the above-mentioned welding after sealing the penetrating condenser of the pressure case 60. However, solder may also be provided to the penetrating hole of the penetrating condenser after welding the holder 30 and the pressure case 60.

The present embodiment also explains the case where the pressure sensor adopts an absolute pressure method where the reference pressure space is vacuum. However, the pressure sensor may adopt a sealed gauge pressure method where dry air, nitrogen gas, helium gas and the like is filled to the reference pressure space with a predetermined pressure.

Moreover, according to the present invention, when forming the sealed gauge pressure-type pressure sensor, the helium gas and the like explained above may be filled inside the reference space by a capillary tube and the like after sealing the penetrating condenser and welding the holder 30 and the pressure case 60 together.

Even further, according to the present invention, since the electric circuit portion is completely covered electromagnetically by the pressure case 60 and the holder 30, and a penetrating condenser is placed between the lead wire 46 and the pressure case 60, the power noise or electromagnetic noise from the exterior may be released to the housing 10 without effecting the electromagnetic circuit, so the electric circuit may be free from erroneous operation caused by noises.

Figure 2:
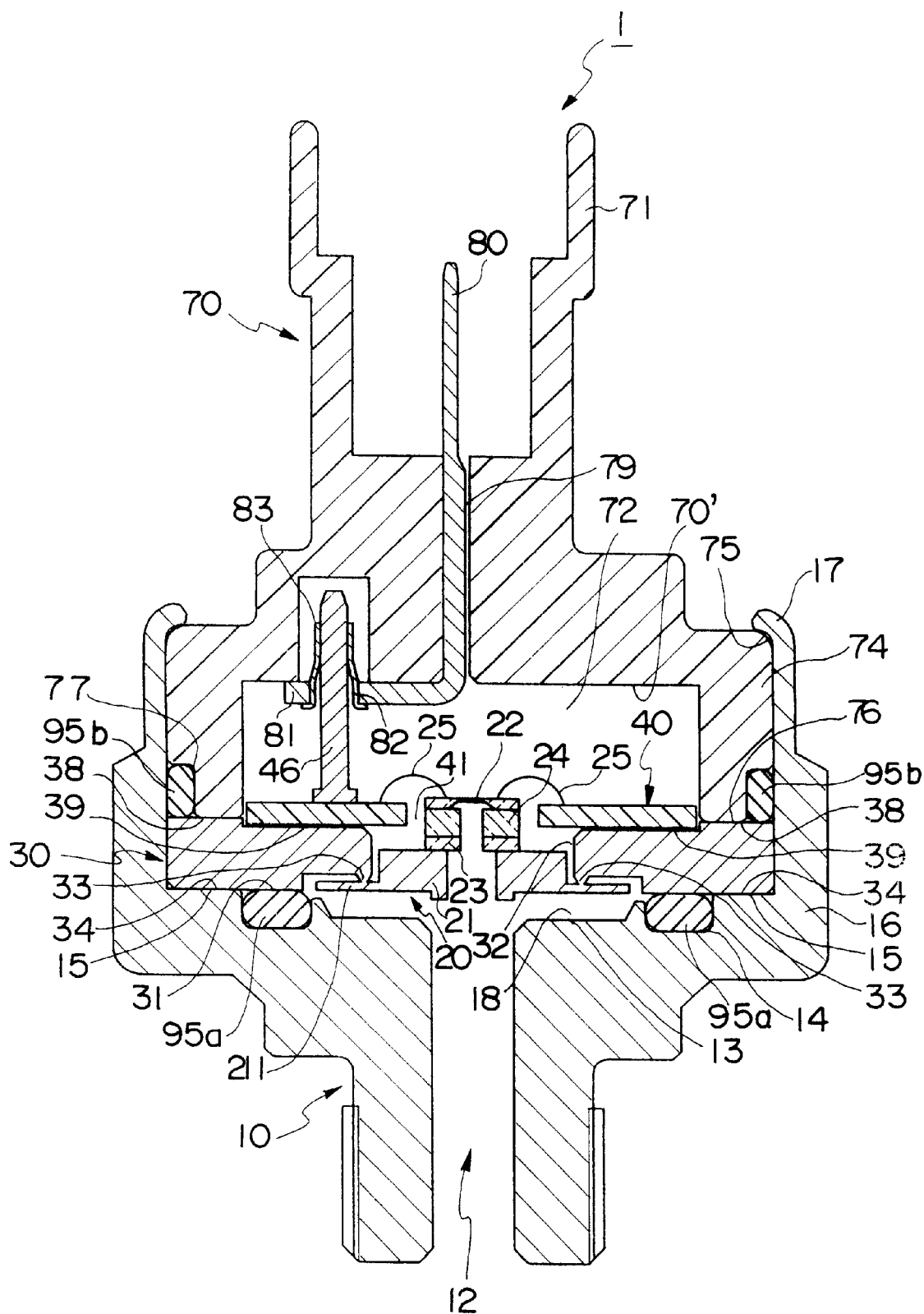
FIG. 2 is a vertical cross-sectional view showing the structure of the pressure sensor according to the second embodiment of the present invention.

The second embodiment of the pressure sensor according to the present invention will now be explained with reference to FIG. 2. FIG. 2 is a vertical cross-sectional view showing the structure of the pressure sensor according to the second embodiment.

The pressure sensor 1 according to the second embodiment of the present invention differs from the pressure sensor 1 shown in FIG. 1 in that the circuit board is a single circuit board 40 instead of the first circuit board 40 and the second circuit board 45, the structure for supporting the sensor element is simplified, the pressure case 60 is omitted, and the connection between the circuit board 40 and the terminal 80 is simplified.

The pressure sensor 1 according to the second embodiment of the invention basically comprises a housing 10, a sensor element 20, and a holder 30 for maintaining the sensor element 20 to an airtight condition.

The pressure sensor 1 is formed so that the container formed of the housing 10 and a connector case 70 stores a pressure sensor body comprising the sensor element 20, the sensor element holder 30 and the circuit board 40.

The housing 10 is formed to have a substantially cylindrical shape by an aluminum material and the like.

The housing 10 is comprised of the following. An opening 12 is formed on the lower portion of the housing for introducing fluid. On the upper portion of the opening is formed a circular bottom portion 13, and surrounding the bottom portion is an annular groove 14 working as an o-ring receiver, and on the outer and upper portion thereof is formed a flat surface 15 working as a holder receiver. A surrounding wall 16 is formed to rise from the outer peripheral of the flat surface, and a narrow portion 17 is mounted on the upper end of the surrounding wall. Further, an interior space 18 is formed inside the housing 10 defined by the bottom portion 13, the flat portion 15 and the surrounding wall 16.

The sensor element 20 holds a function of sensing pressure, and the element comprises a metallic base plate 21, a pressure sensing element 22 formed of a semiconductor element where plurality of resistors are formed as a bridge on the upper surface of the semiconductor board, a lower base 23 made of silicon fixed airtightly to the upper surface of the base plate 21, and an upper base 24 made of glass mounted and fixed airtightly to the upper surface of the lower base 23.

The lower base 23 is mounted and fixed to the upper surface of the base plate 21. The upper base 24 is mounted and fixed airtightly to the upper surface of the lower base 23. The pressure sensing element 22 is mounted and fixed to the upper surface of the upper base 24 so that the surface mounting the resistors is positioned as the upper surface.

A collar portion 211 is formed on the lower peripheral of the base plate 21.

The pressure sensing element 22 is formed so that the plain shape of the semiconductor substrate is rectangular, and the center area thereof is formed thinner, so as to form a diaphragm portion which will be deformed by pressure. On the upper surface of the diaphragm is formed a pressure sensing portion which is a strain gauge, having a plurality of resistors formed in a bridge-state. On the surrounding thick portion of the substrate are mounted electric circuits such as a processing circuit or an amplifying circuit formed by use of an integrated circuit manufacturing technique.

Further, a land portion not shown in the drawing formed on the upper surface of the pressure sensing element 22 and the land portion not shown in the drawing formed on the upper surface of the circuit board 40 are connected by a bonding wire 25.

The upper base 24 made of a glass material such as a Pyrex glass (trademark) and the like is formed to have a rectangular plain shape, with a penetrating hole formed in the center thereof.

The lower base 23 made of silicon is formed to have a rectangular plain shape, with a penetrating hole formed in the center thereof. The surface of junction of the lower base 23 with the base plate 21 is formed a gold plated layer by gold sputtering and the like.

The base plate 21 is formed using an iron-nickel system alloy of 42 alloy and the like, and the plain shape thereof is circular, with a penetrating hole formed in the center thereof. The surface of junction of the base plate 21 with the lower base 23 is formed a gold plated layer.

The penetrating holes formed on the upper base 24, the lower base 23 and the base plate 21 are positioned coaxially, and being communicated to the fluid introducing opening 12 of the housing 10, so as to guide the pressure fluid to the space formed on the back surface of the pressure sensing element 22.

The lower surface of the pressure sensing element 22 is welded and fixed airtightly to the upper surface of the upper base 24 by an anode junction (FAB junction). The lower surface of the upper base 24 is welded and fixed airtightly to the upper surface of the lower base 23 by an anode junction. By intervening a gold-silicon raw material and providing heat application (scrub), a gold-silicon alloy is formed to the lower surface of the lower base 23 and the upper surface of the base plate 21, thereby welding and fixing the base 23 and the base plate 21 airtightly.

The sensor element holder 30 holds a function of supporting the sensor element 20. The holder 30 is formed by a stainless steel for example, to a substantially flat disk-like shape having an opening 32 in the center area thereof. The sensor element holder 30 is equipped with an annular protrusion 33 formed on the bottom surface 31 so as to surround the opening 32.

Further, in the area around the bottom surface 31 of the sensor element holder 30 is formed a housing contact surface 34 having a flat surface and opposing the sensor element holder receiver 15 of the housing 10.

On the upper surface of the sensor element holder 30 are formed a connector case receiver 38 with a flat surface for receiving the connector case 70, which is positioned in the peripheral area, and a circuit board receiver 39 for receiving the circuit board 40, which is positioned near the center.

The circuit board 40 is fixed to the circuit board holder 39 by an adhesive and the like.

The upper surface of the collar portion 211 of the base plate 21 in the sensor element 20 is contacted to the annular protrusion 33 mounted on the lower surface 31 of the sensor element holder 30, and the two members are fixed airtightly to each other by a projection welding and the like.

The circuit board 40 is formed of an insulating printed circuit board, and an opening 41 is formed to the center thereof where a pressure sensing element 22 of the sensor element 20 is positioned, and a lead 46 for taking out the signal from the sensor element to the exterior is positioned on the upper area thereof.

A connector case 70 is a resin case to which a terminal 80 is inserted and fixed. The case 70 comprises a socket 71 formed on the upper portion thereof, an interior space 72 formed below the socket 71, a thick wall portion 74 formed on a surrounding wall 73 hanging down in the peripheral area, a caulk receiver 75 formed on the outer upward area of the thick wall portion, a flat surface 76 on the lower end of the surrounding wall, an o-ring receiver 77 formed on the outer peripheral of the flat surface, and a terminal insertion hole 79 through which the terminal 80 extends. The terminal 80 having a bent end 81 on the lower area is inserted to the terminal insertion hole 79 from the lower direction, and fixed thereto.

The connector case 70 and the terminal 80 may also be formed integrally by molding and the like.

An opening 82 is mounted on the end portion 81 of the terminal 80, to which a lead receive case 83 is fixed for inserting the lead 46 mounted on the circuit board 40.

The connector case 70 may be adopted to various shapes of connectors by varying its design.

The circuit board 40 is formed of an insulating resin and the like, formed to have a rectangular shape with an opening 41 on the center area thereof for mounting the sensor element 20. On the surface of the board 40 is mounted circuit elements constituting amplifying circuits and processing circuits not shown in the drawing, and the signal from the pressure sensing element 22 is inputted to the circuit elements through a bonding wire 25.

On the input/output terminal of the circuit board 40 is mounted a lead 46 in the shape extending to the upward direction.

A lead 46 is a lead wire for connecting the terminal 80 and the input/output terminal (land portion) formed on the circuit board 40, and the lead 46 includes signal wires, power supply wires and ground wires. The base of the lead 46 is mounted on a land portion formed on the circuit board 40 not shown, and electrically connected and fixed thereto by soldering and the like.

The lead 46 is connected by being inserted to the lead receive case 83 mounted on the end portion 81 of the terminal 80, so as to be connected to the exterior.

The power wire and the ground wire of the terminal 80 is used for supplying power to the electrical circuit, and the ground wire and the signal wire of the terminal 80 is used for taking out the output signal from the sensor element 20 to the exterior.

O-rings 95a and 95b are each inserted to an O-ring receive groove 14 and an O-ring receive groove 77, so as to prevent water or moisture and the like from entering the interior space 72 of the connector case 70, and at the same time, prevent leakage of pressure.

The steps for assembling the pressure sensor 1 using the above-mentioned members will now be explained.

First, the sensor element 20 is assembled. The element 20 is formed as explained above by use of the upper base 24, the lower base 23 and the base plate 21.

Next, the pressure sensing element 22 of the sensor element 20 is inserted to the opening 32 of the sensor element holder 30, and then the upper surface of the collar portion 211 on the base plate 21 is mounted to the annular protrusion 33. Then, a projection electrode having approximately the same annular shape as the protrusion 33 is contacted to the back surface of the collar portion 211, so as to weld and fix the collar portion to the annular protrusion 33 airtightly.

Next, the circuit board 40 is fixed to the circuit board receiver 39 of the sensor element holder 30 by an adhesive, and then the land portion of the pressure sensing element 22 and the land portion of the circuit board 40 are connected by the bonding wire 25.

Then, the pressure sensor assembly gained by the above steps is inserted to the interior space 18 of the housing 10 having an o-ring 95a positioned on the o-ring receiver 14 of the housing 10, and the housing contact surface 34 of the sensor element holder 30 is contacted to the sensor element holder receiver 15 of the housing 10.

Next, the tip of the lead 46 is positioned so as to be inserted to the lead receive case 83 of the terminal 80 fixed to the connector case 70. The connector case 70 is then put above the connector case receiver 38 of the sensor element holder 30 so as to cover the same, with a waterproof o-ring 95b intervened therebetween.

Thereafter, the narrow area 17 on the upper end of the rising portion 16 of the housing 10 is caulked to the caulk receiver 75 of the connector case 70, so as to fix the housing 10 to the connector case 70.

By the above-mentioned steps, the pressure sensor 1 may be assembled.

According to the present invention, since the base plate 21 is welded to the sensor element holder 30 in the sensor element 20, the members may be firmly welded by selecting the same material, or selecting materials that may be welded together firmly and easily. Therefore, even if the material of the housing 10 differs from the material of the base plate 21 of the sensor element 20, there is no trouble in welding the metal materials.

Moreover, according to the present invention, the upper surface of the collar portion 211 on the base plate 21 of the sensor element is welded and fixed to the annular protrusion 33 formed on the outer bottom surface 31 of the holder 30. Therefore, the pressure to be measured will be loaded to the direction pressing the base plate 21 toward the protrusion 33, and not to the opposite direction pulling the welded surfaces away from each other. Therefore, the airtightness of the device may be maintained for a long period of time, and a pressure sensor having a long lifetime may be provided.

Further, according to the embodiment shown in FIG. 2, the connector case 70 and the terminal 80 may be formed integrally by molding, and the terminal insertion hole 79 may be omitted, so that the holder 30, the sensor element 20 and the connector case 70 may define a sealed interior space, which may also be utilized as a reference pressure space. Helium gas and the like may be sealed inside this reference pressure space, so as to realize a sealed gauge pressure-type pressure sensor. Moreover, by measuring the helium gas leaking from the reference pressure space, the leakage in the seal may be recognized at once if such leakage occurs to the pressure sensor.

Even further, by applying metallic plate or metallic foil to the inner surface 70' of the connector case 70 extruding the portion of the terminal 80, the connector case 70 may also maintain the function as an electromagnetic shield member.

Figure 3:
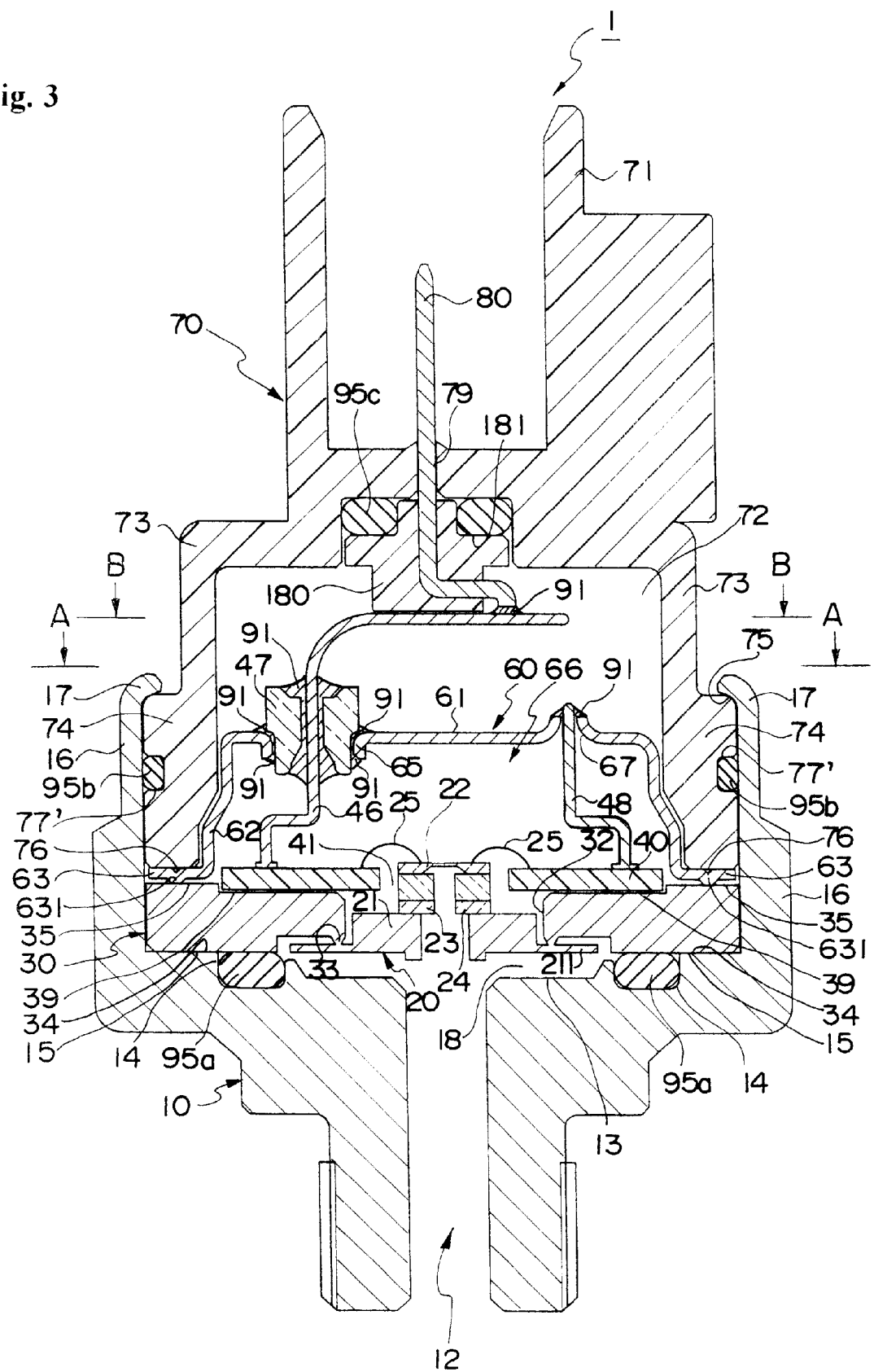
FIG. 3 is a vertical cross-sectional view showing the structure of the pressure sensor according to the third embodiment of the present invention.
Figure 4:
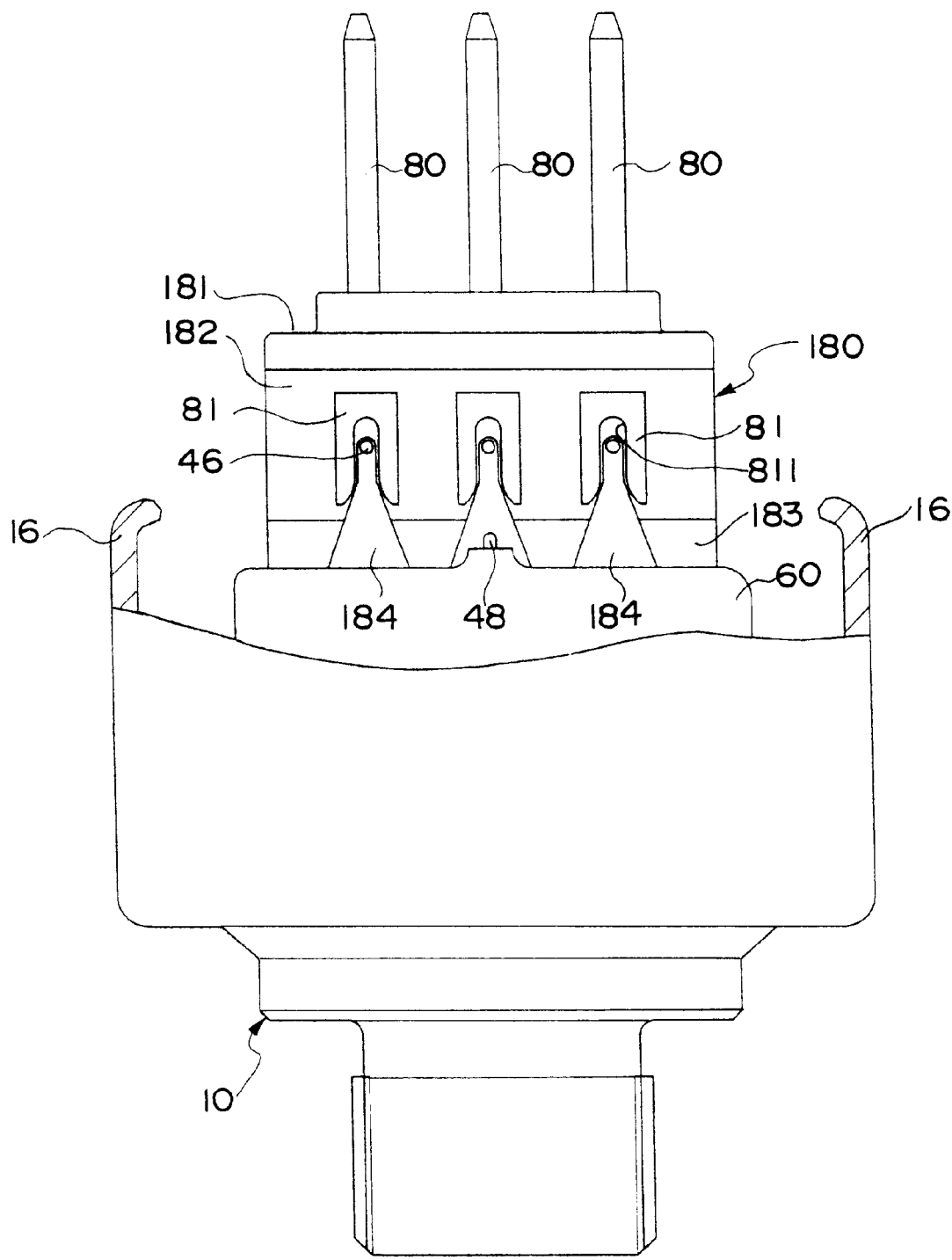
FIG. 4 is a side view showing the structure of the pressure sensor according to the third embodiment of the present invention where one area is removed.
Figure 5:
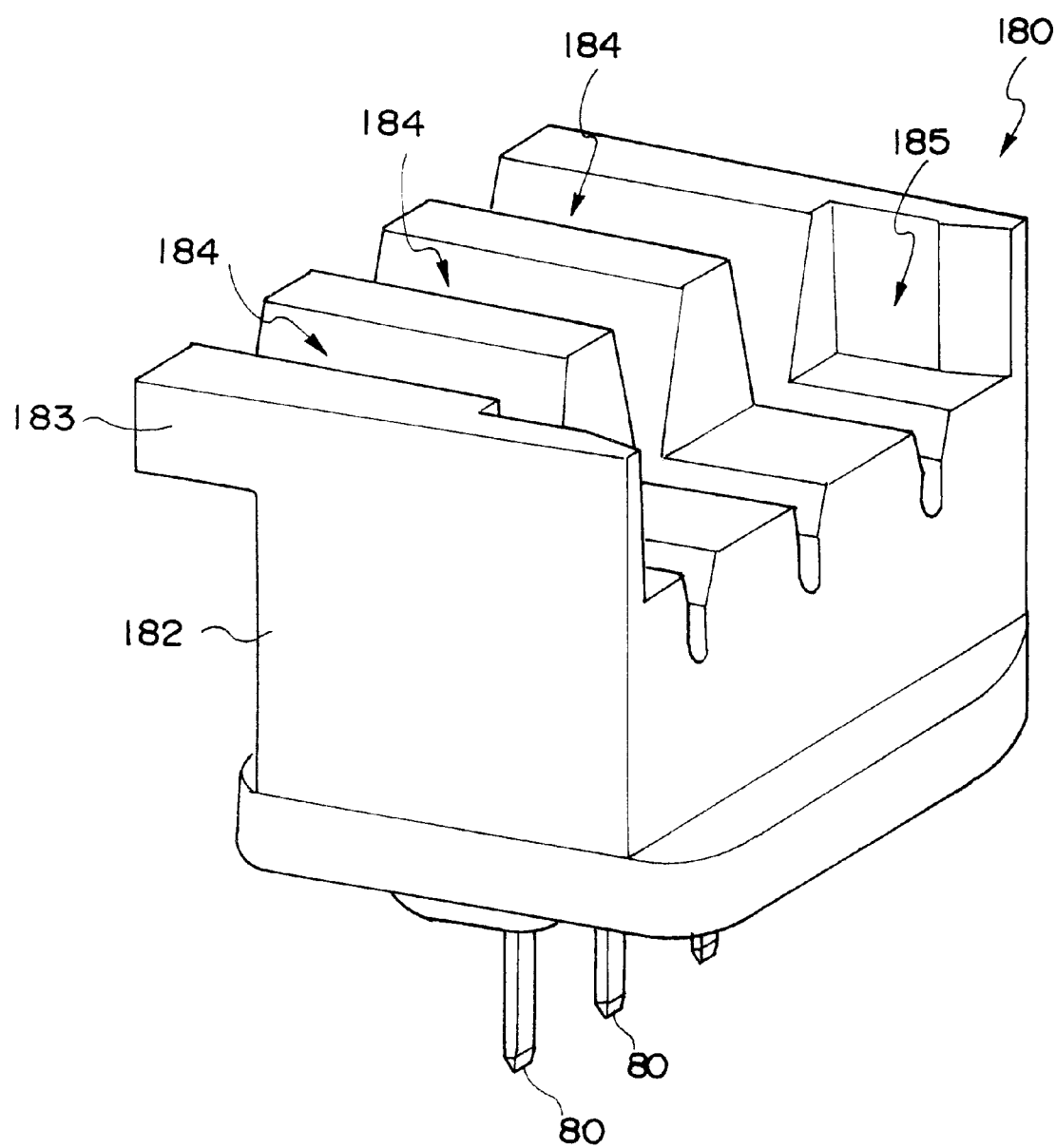
FIG. 5 is a schematic view showing the exterior shape of the terminal holder to be used in the pressure sensor according to the third embodiment.
Figure 6:
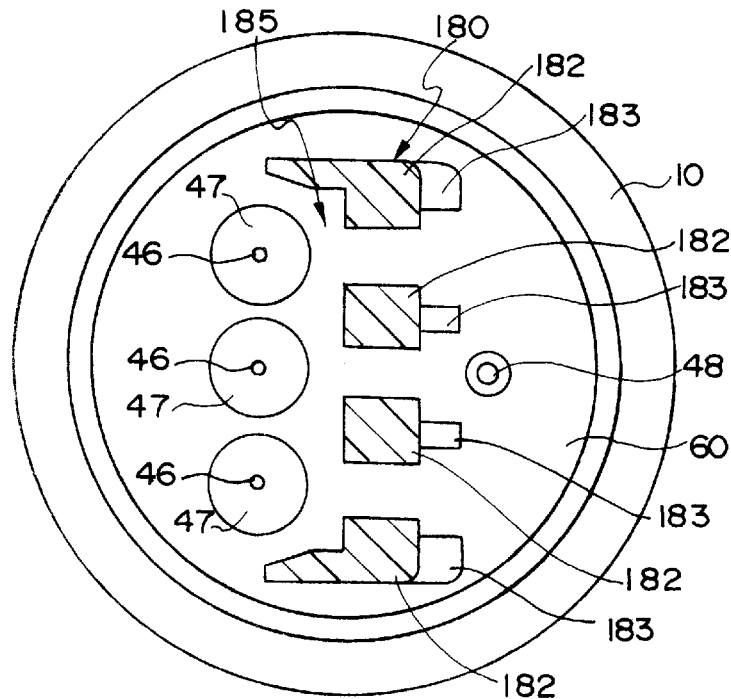
FIG. 6 is a cross-sectional view taken at line A—A of FIG. 3.
Figure 7:
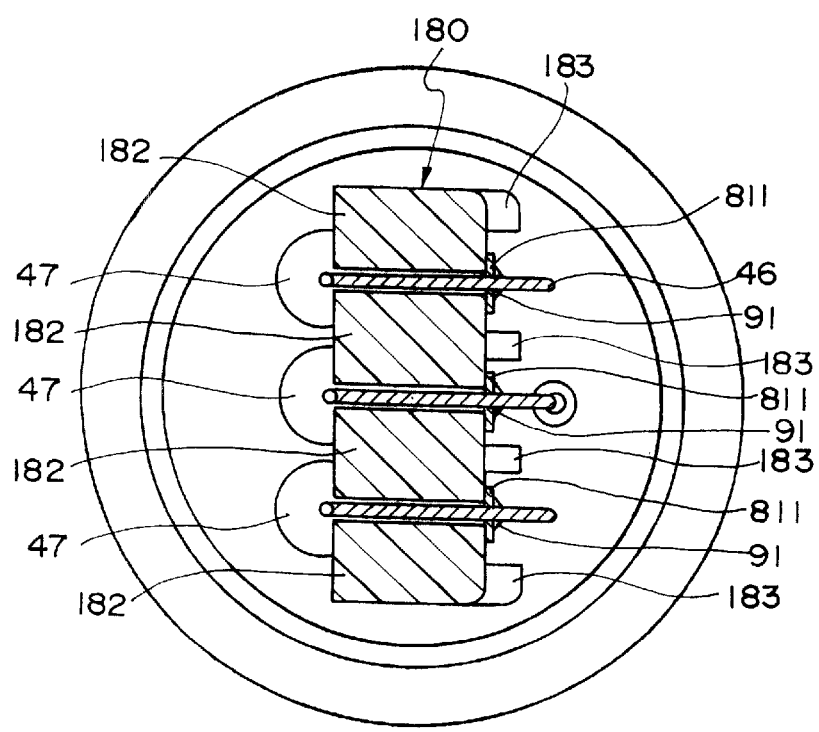
FIG. 7 is a cross-sectional view taken at line B—B of FIG. 3.

Next, the third embodiment of the pressure sensor according to the present invention will be explained with reference to FIGS. 3 through 7. FIG. 3 is a vertical cross-sectional view showing the structure of the pressure sensor from the front side. FIG. 4 is a side view of the pressure sensor of FIG. 3 taken from the right side, where the connector case is removed and one portion of the rising portion of the housing is taken away. FIG. 5 is an explanatory view showing the shape of the terminal holder to be used in the present embodiment, and it is a schematic view of the terminal holder shown in FIG. 4 which is turned upside down and seen from the upper oblique position. FIGS. 6 and 7 are a view of the pressure sensor shown in FIGS. 3 and 4 seen from the upper side. FIG. 6 is a view of the cross-section taken at line A—A of FIG. 3 seen from the upper direction, and FIG. 7 is a view of the cross-section taken at line B—B of FIG. 3 seen from the upper direction.

The pressure sensor 1 according to the third embodiment of the present invention differs from the pressure sensor 1 shown in FIG. 1 in that there is only one circuit board, the sensor element holder 30 for supporting the sensor element is formed to have a simple shape, and a terminal holder 180 positioned above the pressure case 60 is equipped.

The pressure sensor 1 according to the third embodiment comprises a housing 10, a sensor element 20, a holder 30, a circuit board 40, a pressure case 60, a connector case 70, and a terminal holder 180.

The pressure sensor 1 is formed so that the container formed of the housing 10 and the connector case 70 stores the pressure sensor body comprising the sensor element 20, the sensor element holder 30 and the pressure case 60.

In the present embodiment, the sensor element 20 and the sensor element holder 30 is formed to have substantially the same structure as the second embodiment. Therefore, the detailed explanations thereof are omitted. The same members as the ones shown in the second embodiment are provided with the same reference numbers as that of FIG. 2.

The circuit board 40 is formed of an insulating printed circuit board, having an opening 41 formed in the center area thereof for placing the pressure sensing element 22 of the sensor element 20. On the surface of the circuit board are mounted circuit elements forming an amplifying circuit or a processing circuit not shown in the drawing, and the signal from the pressure sensing element 22 is inputted to the circuit element through a bonding wire 25.

A plurality of leads 46, three for example in the present embodiment, are mounted on the circuit board 40 for supplying the power voltage or taking out the detection signal to the exterior. The lead 46 is a wire for connecting the terminal 80 and the input/output terminal (land portion) formed on the circuit board 40, which includes a signal wire, a power supply wire and a ground wire. The base of the lead 46 is mounted on the land portion formed on the circuit board 40 not shown, which is electrically connected thereto by soldering and the like.

Further, a bypassing condenser not shown in the drawing is mounted on the circuit board 40, which is connected in parallel relation with the penetrating condenser. A lead 48 connected to the bypassing condenser is equipped.

That is, in the first embodiment shown in FIG. 1, the terminal 80 is mounted through a penetrating condenser having electrodes mounted on the inner and outer surfaces of the pipe-like dielectric 47, and the electromagnetic noise from the exterior is set to pass through the penetrating condenser. According to the third embodiment of the invention, the electromagnetic noise which can not be removed by using the penetrating condenser may be removed by connecting bypassing condensers in parallel relation with the penetrating condenser connected to the terminal 80, and commonly connecting the other end of the bypassing condensers to the pressure case 60 through a lead 48.

The pressure case 60 is formed for example of stainless steel, and functions as an electromagnetic shield covering the sensor element 20 positioned in its interior space for protection from exterior noise, and works as a member for defining an airtight interior space.

The pressure case 60 comprises a disk-shaped ceiling portion 61, a surrounding wall 62 rising from the peripheral portion thereof, a collar portion 63 formed by bending the end of the surrounding wall 62 to the outward direction and having an annular protrusion 631 on its lower surface to be welded on the receiving surface 35 of the sensor element holder 30, an opening 65 through which a penetrating condenser extends forming a lead takeout portion, and an opening 67 to which the tip of the lead 48 extending from the bypassing condenser is inserted, the opening 67 being a new feature in the present embodiment. An interior space 66 is formed inside this hat-like pressure case 60.

The annular protrusion 631 formed on the lower surface of the collar portion 63 in the pressure case 60 is contacted to the receive surface 35 of the sensor element holder 30, and the two members are welded airtightly together, by pressing a projection electrode having the similar annular shape as the annular protrusion from above the annular protrusion.

The tip of the lead 46 mounted on the circuit board 40 is taken out to the exterior of the pressure case 60 through the penetrating hole of the pipe-like dielectric 47 inserted and fixed to the opening of the pressure case 60, forming the penetrating condenser. The penetrating hole of the dielectric 47 through which the lead 46 extends is sealed by a solder 91.

Similarly, the tip of the lead 48 connected commonly to the plurality of bypassing condensers mounted on the circuit board 40 is inserted to the opening 67 of the pressure case 60, and connected thereto by a solder 91, so that the pressure case 60 is sealed.

A connector case 70 is a resin case to which a terminal 80 is inserted and fixed. The case 70 comprises a socket 71 formed on the upper portion thereof, an interior space 72 formed below the socket 71, a surrounding wall 73 extending to the downward direction, a thick wall portion 74 formed below the surrounding wall 73, a caulk receiver 75 formed on the outer upward area of the thick wall portion, a flat surface 76 on the lower end of the surrounding wall, an o-ring receiver 77' formed of an annular groove mounted to the outer peripheral of the thick wall portion 74, and a terminal insertion hole 79 formed below the socket 71 through which the terminal 80 penetrates.

The connector case 70 is capable of being corresponded to various types of connectors by changing its design.

The embodiment shown in FIG. 3 shows the case where the annular protrusion 631 is formed on the collar portion of the pressure case 60. However, the present invention is not limited to such case, but in stead, the annular protrusion may be formed on the receiving surface 35 opposing the collar portion of the pressure case in the holder 30, which may be fixed to the lower surface of the collar portion 63 in the pressure case 60 by projection welding, so as to maintain airtightness.

As shown in FIGS. 3 and 4, the lead 46 taken out from the pressure case 60 is bent in the middle, and the tip portion is inserted to a notch 811 formed on the terminal end 81 fixed to the terminal holder 181, which is connected and fixed thereto by a solder 91.

The power wire and the ground wire of the terminal 80 is used for supplying power to the electrical circuit, and the ground wire and the signal wire are used for taking out the output signal from the sensor element 20 to the exterior.

FIGS. 3 through 7 are used to explain the structure of the terminal holder 180 according to the present embodiment. The terminal holder 180 is formed by molding an insulating resin. The terminal holder 180 comprises a flat o-ring receiver 181 formed on its upper portion, a body 182, legs 183, lead guide grooves 184, and notches 185 for clearing the penetrating condenser. Three terminals 80 are molded to the body. The terminal 80 is formed to have a crank shape, with areas bent by 90 degrees to the opposite direction. The end 81 on the lead side of the terminal is formed to have a fork end, with a notch 811 formed on its tip portion.

As could be seen from FIG. 5 showing the terminal holder 180 in the up-side-down position, the lead guide grooves 184 are formed so that the width toward the ceiling 61 of the pressure case 60 is widened, and the width toward the end 81 of the terminal is narrowed. As shown in FIG. 3, the leads 46 being bent is positioned to the lead guide grooves 184, and the terminal holder 180 may be taken down to the ceiling 61 of the pressure case, so as to easily guide the tip of the bent leads 46 to the fork end 811 on the end 81 of the terminal.

In this state, the leads 46 and the ends 81 of the terminal are soldered.

O-rings 95a and 95b are each inserted to an o-ring receive groove 14 and an o-ring receive groove 77', so as to create a sealed structure. This enables to prevent water or moisture and the like from entering the interior space 72 of the connector case 70.

Moreover, an o-ring 95c is mounted to the o-ring receiver 181 of the terminal holder 180, which is inserted to the concave portion formed to each wall of the connector case 70 so as to create a sealed structure. This enables to prevent water or moisture and the like from entering the interior space 72 of the connector case 70 through the terminal penetrating hole 79, and prevents leakage of pressure.

The steps for assembling the pressure sensor 1 will now be explained.

The assembling of the sensor element 20, the fixing of the element 20 to the sensor element holder 30, and the mounting of the circuit board 40 is similar to that of the second embodiment.

The lead 46 mounted to the circuit board 40 is positioned and inserted to the penetrating hole of the dielectric 47 soldered to the penetrating condenser opening 65 of the pressure case 60, and the tip of the lead 48 mounted to the circuit board is positioned and inserted to the bypassing condenser ooepening 67. Then, after connecting the annular protrusion 631 formed on the collar portion 63 of the pressure case 60 and the pressure case receiver (welding surface) 35 of the sensor element holder 30, solder 91 is poured into the penetrating hole of the penetrating condenser and the opening 67, so as to shut the opening of the pressure case 60.

When doing so, the pressure inside the interior space should be either vacuum or decompressed, so as to fill the interior of the penetrating hole completely with the molten solder 91.

Thereafter, a projection electrode having the similar shape as the annular protrusion 631 formed on the collar portion 63 of the pressure case 60 is pressed to the upper surface of the collar portion, so as to perform projection welding to the collar portion 63 and the welding surface 35 under a helium gas atmosphere and the like.

The sealing step of the penetrating hole in the penetrating condenser and the opening 67, and the welding step of the pressure case 60 and the sensor element holder 30 may be performed in either order.

According to the present embodiment, the collar portion 63 of the pressure case 60 and the pressure case receiving surface 35 of the sensor element holder 30 may be welded easily and firmly, thereby assembling a pressure sensor body having a sealed interior space 66 working as a reference pressure space.

The pressure sensor body assembled as above is inserted to the interior space 18 so that the housing contact surface 34 of the sensor element holder 30 touches the sensor element holder receiving surface 15 of the housing 10. The o-ring 95a is inserted to the o-ring groove 14 of the housing 10.

Next, the middle area of the leads 46 extending above the pressure case 60 are bent, so that the terminal holder may be mounted from above. The bent leads 60 are guided by the lead guide grooves 184, and the tip areas thereof are guided to the fork end 811 on the end 81 of the terminal. After mounting the terminal holder 180 above the ceiling 61 of the pressure case 60, the tip of the leads 46 are soldered to the end of the terminals 80, thereby connecting the leads 46 and the terminals 80.

Then, the tip of the terminals 80 on the terminal holder 180 having the o-ring 95c inserted to the o-ring receiver 181 are penetrated through the penetrating hole 79 of the connector case 70 having a waterproof o-ring inserted to the groove 77', thereby covering the pressure sensor body by the connector case 70. The lower flat surface 76 of the connector case 70 is mounted on the collar portion 63 of the pressure case 60, and the narrowed portion 17 on the upper end of the rising portion 16 of the housing 10 is caulked to the caulk receiver 75 of the connector case 70, thereby fixing the connector case 70 to the housing 10.

The pressure sensor 1 according to the third embodiment of the present invention may be assembled as explained above.

According to the present embodiment, by forming the base plate 21 of the sensor element 20 and the sensor element holder 30 from the same material, the two members may be welded easily and firmly to each other when forming the pressure sensor body. The material of the housing 10 may be selected without having to consider the welding compatibility with the base plate 21.

Moreover, according to the present invention, the upper surface on the collar portion 211 of the base plate 21 in the sensor element 20 is welded and fixed to the annular protrusion 33 formed on the outer lower surface 31 of the sensor element holder 30. Therefore, the pressure to be measured is loaded in the direction pressing the base plate 21 against the protrusion 33, and not to the opposite direction pulling away the welding surface, so the seal between the members may be maintained for a long period of time, and a pressure sensor having a long lifetime may be provided.

Further, according to the present invention, the electrical circuit portion mounted inside the pressure sensor body may completely be sealed electromagnetically by the pressure case 60 and the sensor element holder 30, and at the same time, the penetrating condenser placed between the lead wire 46 and the pressure case 60 releases the power noise or the electromagnetic noise from the exterior to the housing 10 before they enter the electrical circuit portion. Therefore, erroneous operation caused by noise may be prevented. According further to the present embodiment, the bypassing condenser is connected in parallel relation with the penetrating condenser, and the electromagnetic noise is grounded through the pressure case, which enables to remove the electromagnetic noise even more completely.

According to the present embodiment, the terminal 80 is formed to have cranks where two areas are bent to the opposite direction. However, the terminal 80 may alternatively be bent to an L-shape, and an opening may be formed instead of the notch on the other end 81, so that the tip of the lead 46 may be bent further toward the upper direction and inserted to the opening.

The mounting of the terminal holder may be simplified by such structure.

Figure 8:
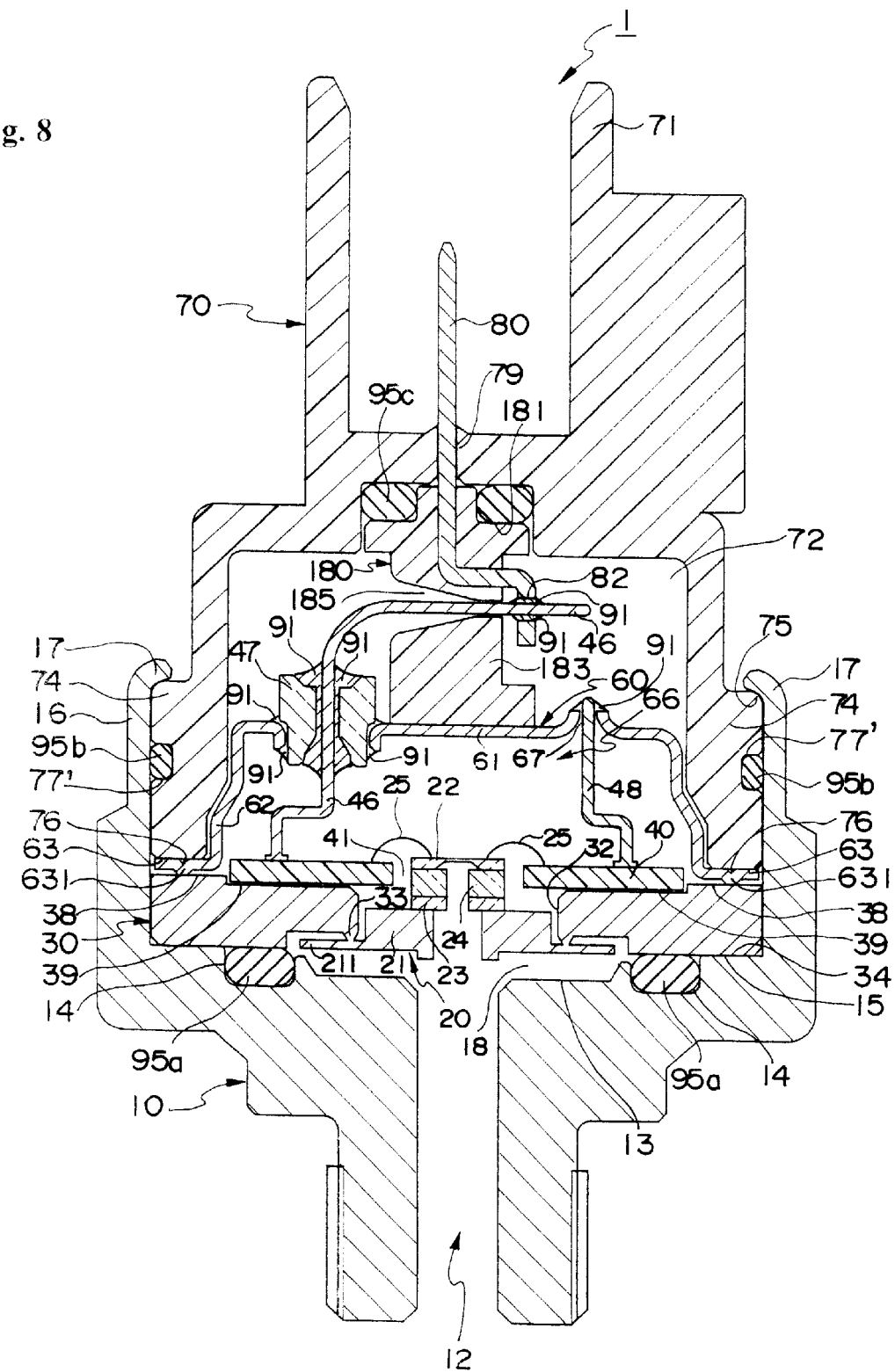
FIG. 8 is a vertical cross-sectional view showing the structure of the pressure sensor according to the fourth embodiment of the present invention.
Figure 9:
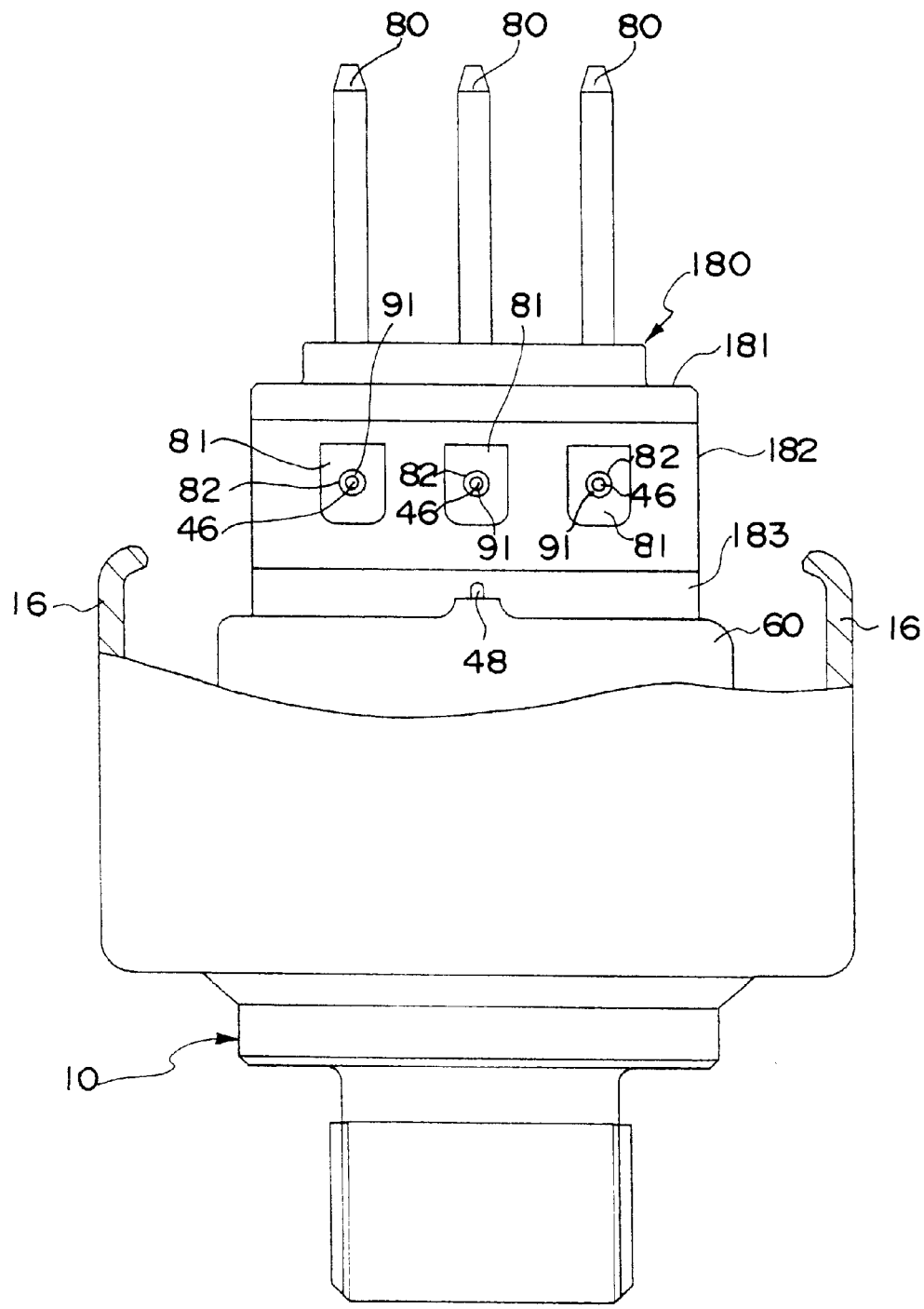
FIG. 9 is a side view showing the structure of the pressure sensor according to the fourth embodiment where one portion is removed.

The fourth embodiment of the pressure sensor according to the present invention will be explained with reference to FIGS. 8 and 9. FIG. 8 is a vertical cross-sectional view showing the structure of the pressure sensor from the front, and FIG. 9 is a side view showing the pressure sensor from the right side of FIG. 8. In FIG. 9, the connector case is removed, and an area in the rising portion of the housing is cut off.

The pressure sensor according to the present embodiment only differ from the pressure sensor of the third embodiment in the shape of the terminal holder 180, and the other structures are substantially the same. Therefore, the explanation on the structures other than the terminal holder 180 are omitted.

The terminal holder 180 of the pressure sensor 1 according to the present embodiment differs from that of the third embodiment in that a penetrating hole 186 for guiding the lead is used instead of the lead guide groove 184 of the terminal holder 180, and that an opening 82 is equipped instead of the fork end 811 on the end 81 of the terminal 80.

The lead guide penetrating hole 82 of the terminal holder 180 is formed to have a larger diameter toward the penetrating condenser and a smaller diameter toward the other end 81 of the terminal 80. The opening toward the other end 81 of the terminal is positioned so as to correspond to the opening 82 formed on the other end 81.

The steps of assembling the pressure sensor 1 by use of this terminal holder is explained below.

The assembling of the pressure sensor body and the mounting of the pressure sensor body to the housing is performed similarly as the third embodiment.

The middle area of the lead 46 extending above the pressure case 60 is bent as shown in FIG. 8 by use of a jig, and the terminal holder 180 is moved from the right side of the drawing to the left side so that the tip of the lead 46 is inserted to the lead guide penetrating hole 186. The tip of the lead 46 guided by the lead guide penetrating hole 186 protrudes to the other end of the terminal 91, and is inserted to the opening 82. In this state, the lead 46 is fixed to the terminal 80 by a solder 91.

Thereafter, the pressure sensor is assembled by steps shown in the third embodiment.

According to the present embodiment, the operation for mounting the terminal holder to the sensor body is simplified compared to the third embodiment.

In the present invention, the shape of the sensor element holder 30 may be either of the following in order to achieve the initial object; the shape shown in the first embodiment with steps where a plurality of circuit boards may be supported, or the shape according to the second, third or fourth embodiment with flat surfaces where a single circuit board may be supported.

Moreover, according to the third and forth embodiments, a protrusion or a concave may be formed to the predetermined position on the bottom surface of the terminal holder 180, and a corresponding concave or a protrusion may be formed to the predetermined position on the ceiling 61 of the pressure case 60, wherein the protrusion may be fit to the convex when positioning the terminal holder 180.

According to the third embodiment, the three penetrating condensers are positioned linearly. However, they may also be positioned in a circle.

Other types of pressure sensors may also be formed by mutually combining the technical methods disclosed in the above embodiments.

As explained above, the present invention enables to provide an absolute pressure type pressure sensor where the pressure case having highly reliable airtightness is vacuum, or a sealed gauge pressure type pressure sensor where the highly reliable airtight pressure case maintains a predetermined gas pressure.

What is claimed is:

1. A pressure sensor for sensing pressure comprising:
   a sensor element formed of a semiconductor element having a piezoresistance effect;
   a base plate for mounting said sensor element;
   a holder to which said sensor element is airtightly fixed using said base plate;
   a pressure case to which said holder is airtightly fixed, said pressure case having an electromagnetic shield function and forming a reference pressure space by covering said sensor element; and
   a housing having a pressure introducing hole supporting said holder,
   wherein said base plate has a collar portion which is connected by welding to said holder.

2. The pressure sensor as recited in claim 1, wherein said reference gas comprises helium gas or nitrogen gas.

3. The pressure sensor as recited in claim 1, wherein said reference pressure space is kept in a vacuum state.

4. The pressure sensor as recited in claim 1, wherein said holder has a central aperture, and said base plate and a peripheral area of said aperture area are connected by welding.

5. The pressure sensor as recited in claim 1, wherein said holder has a central aperture, and said collar portion and a peripheral area of said aperture are connected by welding.

6. The pressure sensor as recited in any one of claims 4 or 5, wherein said welding is projection welding.

7. A pressure sensor comprising:
   a housing having a pressure introducing hole;
   a sensor element formed of a semiconductor element having a piezoresistance effect;
   a holder to which said sensor element is fixed; and
   a pressure case having a ceiling portion, said sensor element, said holder and said pressure case being welded air tightly together to form a reference pressure space,
   wherein said sensor element is formed by mounting said semiconductor element on a metallic base plate having a first collar portion through an upper base and a lower base,
   said holder includes an opening formed in a center portion thereof, an annular protrusion positioned surrounding said opening at a lower surface thereof, and a flat surface formed on a peak surface of a rising portion formed around said holder,
   said pressure case includes a second collar portion where a lower end of a surrounding wall hanging from said ceiling portion is bent outwardly,
   said base plate of said sensor element is welded and fixed airtightly to said annular protrusion of said holder, and
   said second collar portion of said pressure case is welded and fixed airtightly to said peak surface of said holder.

8. The pressure sensor as recited in claim 7, wherein said reference pressure space comprises helium gas or nitrogen gas.

9. The pressure sensor as recited in claim 7, wherein said reference pressure space is kept in a vacuum state.

10. A pressure sensor comprising:
    a metallic housing having a pressure introducing hole;
    a sensor element formed of a semiconductor element having a piezoresistance effect;
    a holder to which said sensor element is airtightly fixed; and
    a metallic pressure case having a ceiling portion, said sensor element, said holder and said pressure case being welded airtightly together to form a reference pressure space,
    wherein said sensor element is formed by mounting said semiconductor element on a metallic base plate having a first collar portion through an upper base and a lower base,
    said holder comprises an interior space, an opening formed in a center portion thereof, an annular protrusion positioned surrounding said opening at a lower surface thereof, and a flat surface formed on a peak surface of the rising portion formed around said holder,
    said pressure case comprises a second collar portion where a lower end of a surrounding wall hanging from a peripheral of said ceiling portion is bent outwardly,
    said base plate is welded and fixed airtightly to said annular protrusion of said holder, and
    said second collar portion of said pressure case is welded and fixed airtightly to said peak surface of said holder.

11. The pressure sensor as recited in claim 10, wherein said reference pressure space comprises helium gas or nitrogen gas.

12. The pressure sensor as recited in claim 10, wherein said reference pressure space is kept in a vacuum state.

13. The pressure sensor as recited in claim 1, claim 7 or claim 10, wherein said pressure case is equipped with an airtight penetrating condenser, and said penetrating condenser guides the output from said sensor element to a predetermined exterior terminal.

14. A pressure sensor according to claim 1, claim 7 or claim 10, wherein said pressure case is equipped with an airtight penetrating condenser, and said penetrating condenser is positioned inside said reference pressure space and being connected to a circuit board for converting the output from said sensor element to a PWM signal.

15. A pressure sensor comprising:
   a sensor element formed of a semiconductor element having a piezoresistance effect, said sensor element being mounted on a base plate;
   a housing for introducing pressure to said sensor element; and
   a holder for airtightly supporting said sensor element, said holder being supported by said housing,
   wherein said base plate has a collar portion which is connected by welding to said holder.

16. The pressure sensor as recited in claim 15, wherein said holder has a central aperture, and said base plate and a peripheral area of said aperture area are connected by welding.

17. The pressure sensor as recited in claim 15, wherein said holder has a central aperture, and said collar portion and a peripheral area of said aperture are connected by welding.

18. The pressure sensor as recited in any one of claims 16 and 17, wherein said welding is projection welding.

19. A pressure sensor comprising:
   a sensor element formed of a pressure sensing element, a base, and a base plate;
   a holder for supporting said sensor element; and
   a housing for supporting said holder, said housing having a pressure introducing hole,
   wherein said base plate of said sensor element is welded airtightly to said holder, and
   said base plate has a collar portion which is connected by welding to said holder.

20. The pressure sensor as recited in claim 19, wherein said holder has a central aperture, and said base plate and a peripheral area of said aperture area are connected by welding.

21. The pressure sensor as recited in claim 19, wherein said holder has a central aperture, and said collar portion and a peripheral area of said aperture are connected by welding.

22. The pressure sensor as recited in any one of claims 20 and 21, wherein said welding is projection welding.

23. A pressure sensor comprising:
   a housing having a pressure introducing hole;
   a sensor element having a pressure sensing element; and
   a holder for supporting said sensor element,
   wherein said sensor element is formed by mounting said semiconductor element on a metallic base plate having a collar portion through an upper base and a lower base,
   said holder comprises an opening formed in a center portion thereof and an annular protrusion positioned surrounding said opening at a lower surface thereof, and
   said base plate of said sensor element is welded and fixed airtightly to said annular protrusion of said holder.

24. A pressure sensor comprising:
   a sensor element formed of a pressure sensing element, a base and a base plate; and
   a holder for supporting said sensor element,
   wherein said base plate has a collar portion which is connected by welding to said holder,
   said base plate of said sensor element is welded and fixed airtightly to said holder,
   said holder is welded and fixed airtightly to a pressure case having an electromagnetic shield function and forming a reference pressure space by covering said sensor element, said holder being further supported by a housing having a pressure introducing hole.

25. A pressure sensor according to claim 24, wherein a predetermined gas is sealed inside said reference pressure space.

26. The pressure sensor as recited in claim 24, wherein said reference pressure space comprises helium gas or nitrogen gas.

27. The pressure sensor as recited in claim 24, wherein said reference pressure space is kept in a vacuum state.

28. A pressure sensor comprising:
   a housing having a pressure introducing hole;
   a sensor element having a pressure sensing element formed of a semiconductor element;
   a holder to which said sensor element is fixed; and
   a pressure case having a ceiling portion, said sensor element, said holder and said pressure case being welded airtightly together to form a reference pressure space,
   wherein said sensor element is formed by mounting said semiconductor element on a metallic base plate having a first collar portion through an upper base and a lower base,
   said holder comprises an opening formed in a center portion thereof, an annular protrusion positioned surrounding said opening at a lower surface thereof, and a flat surface formed on a upper surface thereof,
   said pressure case comprises a second collar portion where a lower end of a surrounding wall hanging from said ceiling portion is bent outwardly, and an annular protrusion is formed on a surface opposing said holder,
   said base plate of said sensor element is welded and fixed airtightly to said annular protrusion of said holder, and
   said annular protrusion formed on a second collar portion of said pressure case is welded and fixed airtightly to said flat surface of said holder.

29. A pressure sensor comprising:
   a housing having a pressure introducing hole;
   a sensor element having a pressure sensing element formed of a semiconductor element;
   a holder for supporting said sensor element; and
   a pressure case having a ceiling portion, said sensor element, said holder and said pressure case being welded airtightly together to form a reference pressure space,
   wherein said sensor element is formed by mounting said semiconductor element on a metallic plate having a first collar portion through an upper base and a lower base,
   said holder comprises an opening formed on a center portion thereof, an annular protrusion positioned surrounding said opening at a lower surface thereof, and an annular protrusion positioned opposing said pressure case,
   said pressure case comprises a second collar portion where a lower end of a surrounding wall hanging from a peripheral of said ceiling portion is bent outwardly,
   said base plate of said sensor element is welded and fixed airtightly to said annular protrusion positioned on a lower surface of said holder, and said second collar portion of said pressure case is welded and fixed airtightly to said annular protrusion on said holder positioned opposing said pressure case.

30. The pressure sensor as recited in claim 29, wherein said reference pressure space comprises helium gas or nitrogen gas.

31. The pressure sensor as recited in claim 29, wherein said reference pressure space is kept vacuum.

32. A pressure sensor according to either of claims 24, 28 or 29, wherein said pressure case is airtightly equipped with a penetrating condenser having electrodes mounted on the inner and outer surfaces of a pipe-like dielectric, and the output from said sensor element is guided to a predetermined exterior terminal by being penetrated through said penetrating condenser.

33. A pressure sensor according to either of claims 24, 28 or 29, wherein said pressure case is airtightly equipped with a penetrating condenser having electrodes mounted on the inner and outer surfaces of a pipe-like dielectric, the output from said sensor element being guided to a predetermined exterior terminal by being penetrated through said penetrating condenser, and a bypassing condenser is connected in parallel relation with said penetrating condenser, the other end of said bypassing condenser being connected to said pressure case.

* * * * *